United States Patent
Pandey et al.

(10) Patent No.: US 10,242,989 B2
(45) Date of Patent: Mar. 26, 2019

(54) POLAR, CHIRAL, AND NON-CENTRO-SYMMETRIC FERROELECTRIC MATERIALS, MEMORY CELLS INCLUDING SUCH MATERIALS, AND RELATED DEVICES AND METHODS

(71) Applicant: Micron Technology, Inc., Boise, ID (US)

(72) Inventors: Sumeet C. Pandey, Boise, ID (US); Lei Bi, Chengdu (CN); Roy E. Meade, Boise, ID (US); Qian Tao, Boise, ID (US); Ashonita A. Chavan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/282,520

(22) Filed: May 20, 2014

(65) Prior Publication Data

US 2015/0340372 A1 Nov. 26, 2015

(51) Int. Cl.
*H01L 27/115* (2017.01)
*H01L 27/11507* (2017.01)
(Continued)

(52) U.S. Cl.
CPC .. *H01L 27/11507* (2013.01); *H01L 21/28291* (2013.01); *H01L 27/1159* (2013.01);
(Continued)

(58) Field of Classification Search
CPC .............. H01L 27/1159; H01L 28/55; H01L 27/11507; H01L 257/295
See application file for complete search history.

(56) References Cited

U.S. PATENT DOCUMENTS 4,179,404 A * 12/1979 Barone ................. B01J 27/198
                                                            502/209
6,504,214 B1 * 1/2003 Yu ...................... H01L 21/28194
                                                            257/347
(Continued)

FOREIGN PATENT DOCUMENTS

CN          1812128 A        8/2006
CN        101894844 A       11/2010
(Continued)

OTHER PUBLICATIONS

Hafnium Oxide Based CMOS Compatible Ferroelectric Materials, by Schroeder et al., ECS Journal of Solid State Scienceand Technology, 2 (4) (2013), N69-N72.*
(Continued)

*Primary Examiner* — Hrayr A Sayadian
(74) *Attorney, Agent, or Firm* — TraskBritt

(57) ABSTRACT

A ferroelectric memory device includes a plurality of memory cells. Each of the memory cells comprises at least one electrode and a ferroelectric crystalline material disposed proximate the at least one electrode. The ferroelectric crystalline material is polarizable by an electric field capable of being generated by electrically charging the at least one electrode. The ferroelectric crystalline material comprises a polar and chiral crystal structure without inversion symmetry through an inversion center. The ferroelectric crystalline material does not consist essentially of an oxide of at least one of hafnium (Hf) and zirconium (Zr).

15 Claims, 5 Drawing Sheets

(51) Int. Cl.
    *H01L 49/02*     (2006.01)
    *H01L 27/1159*     (2017.01)
    *H01L 21/28*     (2006.01)
    *H01L 29/51*     (2006.01)
    *H01L 29/66*     (2006.01)
    *H01L 29/78*     (2006.01)

(52) U.S. Cl.
    CPC ............ *H01L 28/55* (2013.01); *H01L 29/516* (2013.01); *H01L 29/6684* (2013.01); *H01L 29/78391* (2014.09)

(56) References Cited

U.S. PATENT DOCUMENTS

| | | | |
|---|---|---|---|
| 7,514,272 | B2 | 4/2009 | Fukada et al. |
| 7,709,359 | B2 | 5/2010 | Boescke et al. |
| 7,781,813 | B2 | 8/2010 | Tamura et al. |
| 7,927,889 | B2 | 4/2011 | Mitsui |
| 8,304,823 | B2 | 11/2012 | Boescke |
| 2002/0115562 | A1* | 8/2002 | Teunissen ............... B01J 23/002 502/209 |
| 2004/0129987 | A1 | 7/2004 | Uchiyama et al. |
| 2007/0111335 | A1 | 5/2007 | Miyazawa et al. |
| 2010/0135937 | A1 | 6/2010 | O'Brien et al. |
| 2011/0292574 | A1* | 12/2011 | Besling ................... H01G 9/042 361/528 |
| 2013/0122722 | A1 | 5/2013 | Cissell et al. |
| 2013/0280911 | A1 | 10/2013 | Kai et al. |
| 2014/0070289 | A1 | 3/2014 | Tanaka et al. |
| 2015/0179657 | A1* | 6/2015 | Inumiya ............ H01L 21/28291 257/295 |

FOREIGN PATENT DOCUMENTS

| | | |
|---|---|---|
| JP | 2005093095 A | 4/2005 |
| JP | 2007525829 A | 9/2007 |
| JP | 2009-076571 A | 4/2009 |
| JP | 2009096772 A | 5/2009 |
| JP | 2015062551 A | 4/2015 |
| WO | 2004026459 A1 | 4/2004 |
| WO | 2006028005 A1 | 3/2006 |
| WO | 2012/102025 A1 | 8/2012 |

OTHER PUBLICATIONS

International Search Report for International Patent Application No. PCT/US2015/027308, dated Aug. 13, 2015, three (3) pages.
Written Opinion for International Patent Application No. PCT/US2015/027308, dated Aug. 13, 2015, seven (7) pages.
Boscke et al., Ferroelectricity in Hafnium Oxide Thin Films, Applied Physics Letters, vol. 99, (2011), pp. 102903-1-102903-3.
Boscke et al., Phase Transitions in Ferroelectric Silicon Doped Hafnium Oxide, Applied Physics Letters, vol. 99, (2011), pp. 112904-1-112904-3.
Miller et al., Physics of the Ferroelectric Nonvolatile Memory Field Effect Transistor, J. Appl. Phys. vol. 72, No. 12, Dec. 15, 1992, pp. 5999-6010.
Mueller et al., Incipient Ferroelectricity in Al-Doped HfO2 Thin Films, Adv. Funct. Mater. (2012), 6 pages.
Muller et al., Ferroelectric Hafnium Oxide: A CMOS-Compatible and Highly Scalable Approach to Future Ferroelectric Memories, In proceeding of: Technical Digest International Electron Devices Meeting 2013, At Washington D.C., vol. 2013, 5 pages.
Nguyen et al., Sub-Bandgap Defect States in Polycrystalline Hafnium Oxide and Their Suppression by Admixture of Silicon, Applied Physics Letters, vol. 87, (2005), pp. 192903-1-192903-3.
Reyes-Lillo et al., Antiferroelectricity in Thin Film ZrO2 From First Principles, arXiv.org > cond-mat > arXiv:1403.3878, (2014), 6 pages.
Schroeder et al., Hafnium Oxide Based CMOS Compatible Ferroelectric Materials, ECS Journal of Solid State Science and Technology, vol. 2, No. 4, (2013), pp. N69-N72.
Setter et al., Ferroelectric Thin Films: Review of Materials, Properties, and Applications, Journal of Applied Physics, vol. 100, (2006), pp. 051606-1-051606-46.
Japanese Office Action for Japanese Application No. 2016-568022, dated May 30, 2018, 5 pages with English translation.
Centi, G., "Vanadyl Pyrophosphate—A Critical Overview", Catalysis Today, vol. 16, No. 1, (Jan. 1993) pp. 5-26.
European Partial Search Report for European Application No. 15796671.4, dated Dec. 15, 2017, 16 pages.
Notice of Reasons for Rejection from Korean Application No. 10-2016-7035388, dated Jan. 29, 2018, 8 pages with English translation.
Nakayama et al., "TEM Study of Over-Stoichiometric BaRCo4O7+d (R: Y, Dy-Lu)", Transaction of the Materials Research Society of Japan, vol. 34, No. 3, (Jan. 2009) pp. 439-442.
Norway: "Lisetite", Mineral Data Publishing, Version 1.2, (Jan. 2001), retrieved from the Internet: URL: http://www.handbookofmineralogy.org/pdfs/lisetite.pdf (retrieved on Nov. 23, 2017) 1 page.
Japanese Office Action for Japanese Application No. 2016-568022, dated Jan. 15, 2018, 7 pages with English translation.
Extended European Search Report for European Application No. 15796671.4, dated May 4, 2018, 17 pages.
Ferguson, G., "Structure reports for 1985", In: Structure Reports for 1985, D. Reidel Publishing Company, Netherlands (Jan. 1986) pp. 206-207.
Mohapatra et al., "Local structural investigations and speciation of uranium in Sr2P2O7 by time resolved emission spectroscopy and Sr K-edge EXAFS", Chemical Physics Letters, vol. 601, (Apr. 2015), pp. 81-86.
Muller et al., "Ferroelectricity in yttrium-doped hafnium oxide", Journal of Applied Physics, American Institute of Physics, US, vol. 110, No. 11 (Dec. 2011) pp. 114113-1-114113-5.
Sahoo et al., "Synthesis, Characterization, and Photocatalytic Properties of ZrMo 2 0 8", Journal of Physical Chemistry C, vol. 113, No. 24, (Jun. 2009) pp. 10661-10666.
Taiwanese Search Report and Office Action from Taiwanese Application No. 104114941, dated Mar. 28, 2017, 9 pages.
Notice of Reasons for Rejection from Korean Application No. 10-2016-7035388, dated Jul. 30, 2018, 7 pages with English translation.
Chinese Search Report for Chinese Application No. 201580025895.7, dated Oct. 19, 2018, 2 pages.
Chinese Office Action for Chinese Application No. 201580025895.7, dated Oct. 31, 2018, 23 pages.

\* cited by examiner

POLAR, CHIRAL, AND NON-CENTRO-SYMMETRIC FERROELECTRIC MATERIALS, MEMORY CELLS INCLUDING SUCH MATERIALS, AND RELATED DEVICES AND METHODS

TECHNICAL FIELD

Embodiments of the disclosure relate to the field of semiconductor device design and fabrication. More specifically, embodiments of the disclosure relate to methods of forming ferroelectric memory cells including a ferroelectric material and to related semiconductor device structures, such as memory devices.

BACKGROUND

Demands on semiconductor memory devices toward larger storage capacity and faster access speed have continued to increase. Semiconductor memory devices may be categorized into volatile memory devices and non-volatile memory devices. Dynamic Random Access Memory (DRAM) is a prominent volatile memory device, allowing for high speed and high capacity data storage. Examples of non-volatile memory devices include ROM (Read-only-Memory), EEPROM (Electrically Erasable Programmable ROM), FeRAM (Ferroelectric RAM), and MRAM (Magnetoresistive RAM).

With regard to FeRAM devices, a ferroelectric material is used to store information. The FeRAM devices may include a 1T-1C (1 Transistor-1 Capacitor) memory cell design, similar in construction to a DRAM memory cell, wherein one capacitor and one access transistor form a memory cell. While the dielectric material of DRAM cell capacitor is a linear dielectric material, the dielectric material of FeRAM cell capacitor includes a ferroelectric dielectric material. The FeRAM devices may include a 1T (1 Transistor) memory cell design, based on a ferroelectric field effect transistor (FeFET). For FeFET memory cell, the gate isolation material includes a ferroelectric dielectric material.

Ferroelectric (FE) materials are electrically polarizable materials that possess at least two polarization states, which polarization states may be switched by the application of an external electric field. Each polarization state of FE materials remains stable even after the removal of the applied electric field for at least some period of time. Due to this stability of polarization states, FE materials have been used for memory applications. One of the polarization states is considered to be a logic "1" and the other state a logic "0." FE materials have a non-linear relationship between the applied electric field and the apparent stored charge, resulting in a ferroelectric characteristic in the form of a hysteresis loop. Several types of FE memory devices have been reported, such as FeRAM devices, and FeFET for NAND and NOR devices.

Perovskite materials, such as lead zirconate titanate (PZT), have commonly been used as FE materials for the FE memory device applications. However, such conventional FE memory devices often fall short in terms of bit density and scalability because perovskite materials exhibit low remnant polarization (Pr). For FeRAM, the thickness of ferroelectric PZT film must be up to 200 nanometers (nm). Thus, the use of conventional FE materials for the sub 20 nm-FE memory devices has been limited. In addition, conventional FE materials, such as PZT, possess limited compatibility with standard semiconductor processing techniques.

Thin films of silicon doped hafnium oxide ($SiHfO_2$) in orthorhombic phase have been investigated as an FE material for FE memory devices. However, the orthorhombic phase of $SiHfO_2$ is not stable, and certain restrictive processing techniques must be utilized in order to stabilize the orthorhombic phase. For example, a titanium nitride (TiN) top electrode may be formed over the thin film of $SiHfO_2$ material, prior to inducing the crystallization of $SiHfO_2$ material through a high temperature annealing process. By crystallizing $SiHfO_2$ material in the presence of an overlying TiN top electrode cap, the orthorhombic phase of $SiHfO_2$ material is formed and stabilized by the mechanically confining (i.e., capping) effect of TiN top electrode, which mechanically strains the underlying $SiHfO_2$ material. It has been reported that by using such $SiHfO_2$ material as the FE material for an FE memory device, the required thickness of the FE material may be reduced to less than 10 nm.

U.S. Pat. No. 8,304,823, issued Nov. 6, 2012 to Boescke, discloses a method for manufacturing a ferroelectric memory cell. An amorphous oxide layer of Hf, Zr or (Hf, Zr) is formed over a carrier, and then a covering layer is formed on the amorphous oxide layer. Upon heating the amorphous oxide layer up to a temperature above its crystallization temperature in the confinement of covering layer (i.e., mechanical capping), at least part of the amorphous oxide layer alters its crystal state from amorphous to crystalline, resulting in a crystallized oxide layer that is suitable as a FE material for an FE memory cell.

DETAILED DESCRIPTION

Figure 1:
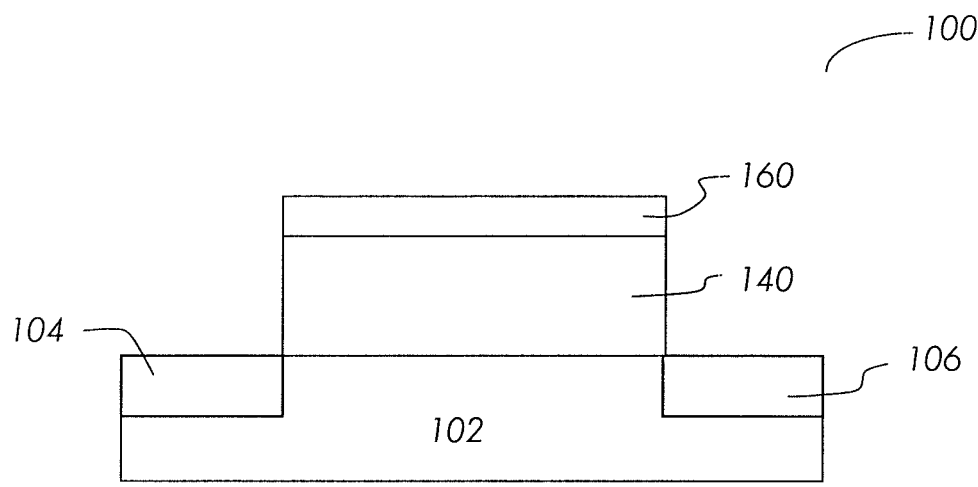
FIG. 1 is a cross-sectional view of a 1T-FeRAM memory cell in accordance with an embodiment of the present disclosure.

Semiconductor structures are disclosed that include a ferroelectric material comprising a polar and chiral crystal structure without inversion symmetry about an inversion center, wherein the ferroelectric (FE) crystalline material does not consist essentially of an oxide of at least one of hafnium (Hf) and zirconium (Zr). The ferroelectric crystalline material may be doped, mechanically strained, or both to prevent formation of inversion symmetry through an inversion center. Also disclosed are methods of forming a semiconductor structure that includes such ferroelectric material, and related semiconductor devices.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided herein does not form a complete process flow for forming a semiconductor device structure, and each of the semiconductor device structures described below do not form a complete semiconductor device. Only those process acts and structures necessary to understand the embodiments of the disclosure are described in detail below. Additional acts to form a complete semiconductor device may be performed by conventional fabrication techniques. Also note, any drawings accompanying the present application are for illustrative purposes only, and are thus not drawn to scale. Additionally, elements common between figures may retain the same numerical designation.

As used herein, the singular forms "a," "an," and "the" are intended to include the plural forms as well, unless the context clearly indicates otherwise.

As used herein, relational terms, such as "top," "bottom," "over," "under," etc., are used for clarity and convenience in understanding the disclosure and accompanying drawings and do not connote or depend on any specific preference, orientation, or order, except where the context clearly indicates otherwise.

As used herein, the term "substrate" means and includes a foundation material or construction upon which components, such as those within a semiconductor device structure are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

The disclosed ferroelectric materials may be suitable for FeRAM devices. As non-limiting examples, the FeRAM devices may include, but not limited to, a 1T-1C (1 Transistor-1 Capacitor) FE memory cell, or a 1T (1 Transistor) FE memory cell based on a ferroelectric field effect transistor (FeFET).

Figure 4A:
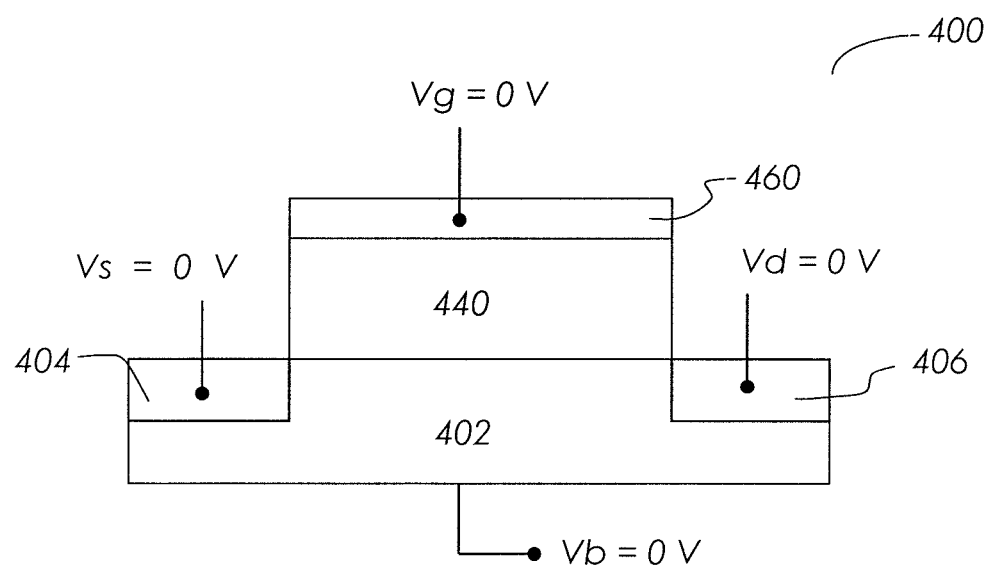
FIG. 4A is a cross-sectional view of a 1T-FeRAM memory cell like that of FIG. 1 in a quiescent state, wherein the voltages of Vd, Vg, Vs, and Vb are set to 0 V.
Figure 4B:
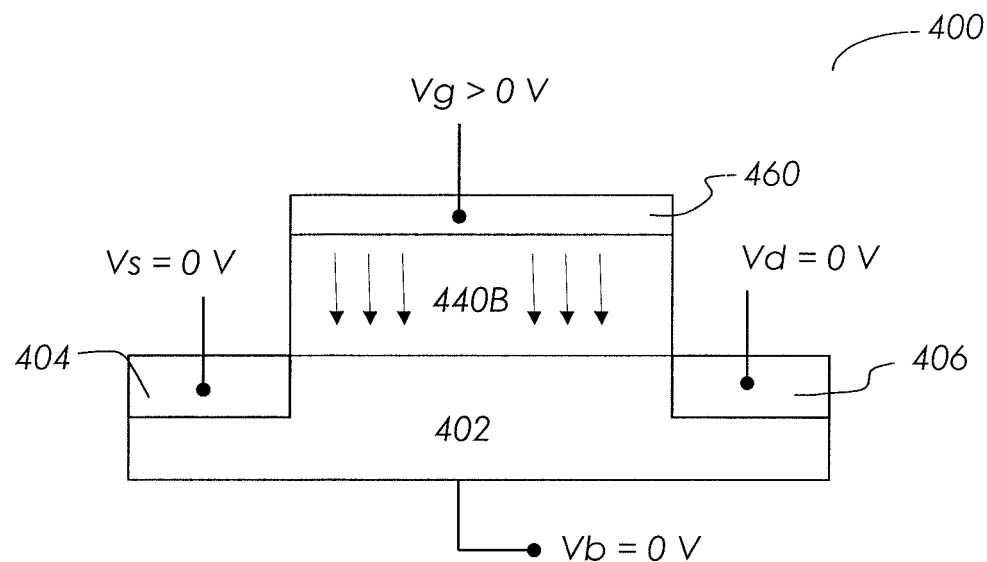
FIG. 4B is a cross-sectional view of a 1T-FeRAM memory cell like that of FIG. 1 in a "write 0" operational state, wherein the gate voltage Vg is set to above 0 V, and Vd, Vs, Vb are set to 0 V.
Figure 4C:
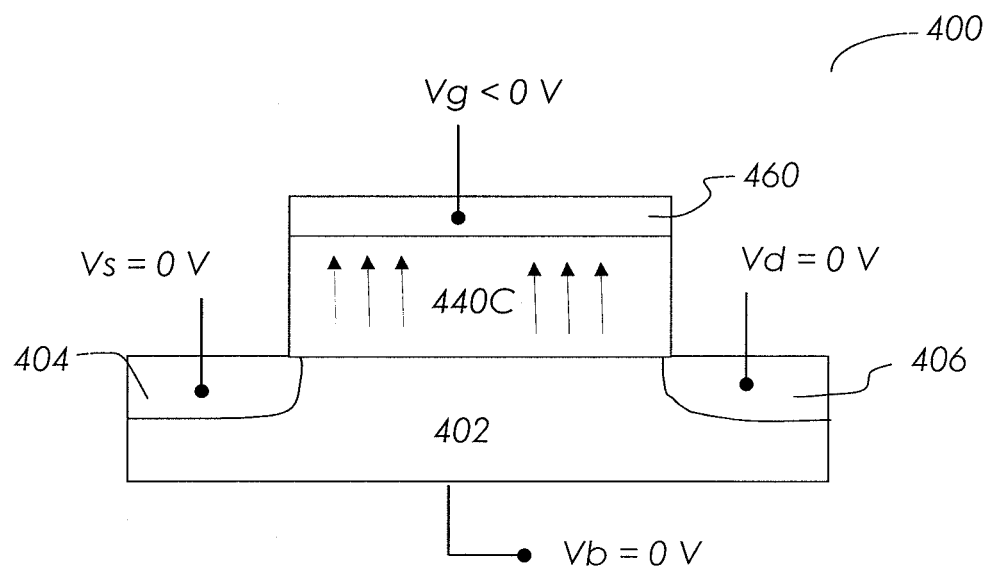
FIG. 4C is a cross-sectional views of a 1T-FeRAM memory cell like that of FIG. 1 in a "write 1" operational state, wherein the gate voltage Vg is set to below 0 V, and Vd, Vs, Vb are set to 0 V.
Figure 5:
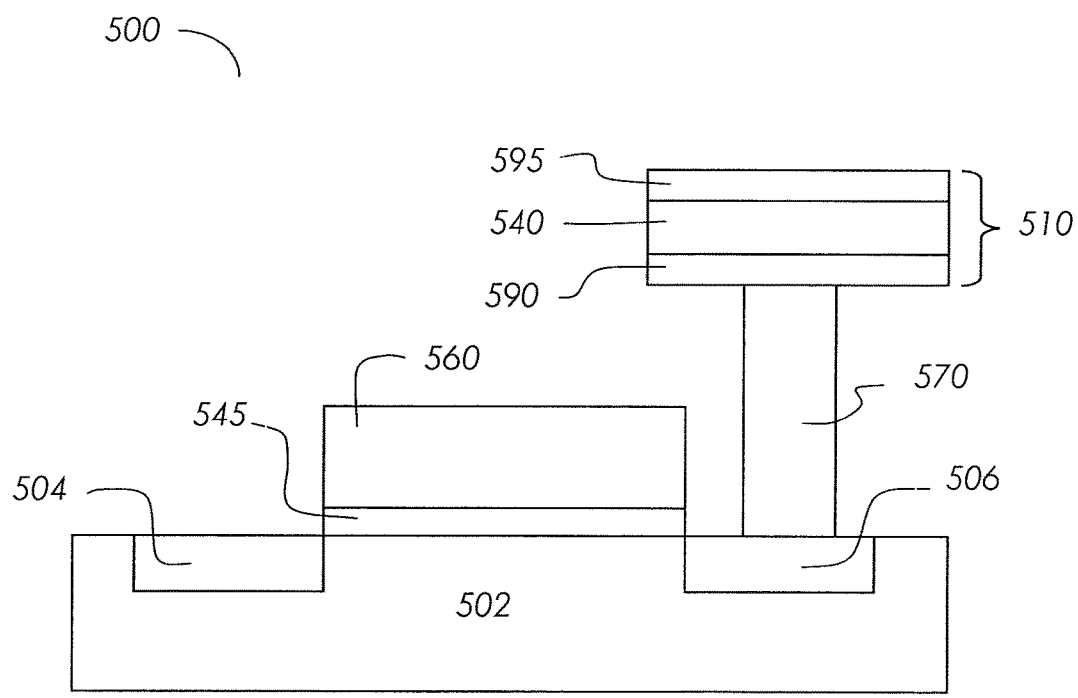
FIG. 5 is a cross-sectional view of a 1T-1C FeRAM memory cell in accordance with another embodiment of the present disclosure.

FIGS. 1-4 show non-limiting examples of 1T-FeRAM memory cells, and FIG. 5 shows a non-limiting example of 1T-1C FeRAM memory cell.

FIG. 1 shows a non-limiting example of the disclosed 1T-FeRAM (FeFET) memory cell that is structurally similar to metal-oxide-semiconductor field-effect transistor (MOSFET) with the linear dielectric oxide material replaced by the disclosed FE crystalline material. The 1T-FeRAM memory cell 100 includes a substrate 102, a source 104, a drain 106, a FE crystalline material 140 over the substrate 102, and a gate electrode material 160 over the FE crystalline material 140.

The FE crystalline material 140 may include a polar and chiral crystal structure without inversion symmetry through an inversion center, wherein the ferroelectric crystalline material does not consist essentially of an oxide of at least one of hafnium (Hf) and zirconium (Zr).

Upon crystallization, the FE crystalline material 140 may form polycrystalline microstructures, wherein at least some grains or crystals within the polycrystalline microstructure have ferroelectric properties. Some grains or crystals within the polycrystalline microstructure may not exhibit ferroelectric properties. In general, the polar, chiral, non-centrosymmetric phase or phases exhibit ferroelectric characteristics.

In some embodiments, the FE crystalline material 140 may comprise a polar, chiral, non-centro-symmetric phase selected from the group consisting of orthorhombic, tetragonal, cubic, monoclinic, triclinic, trigonal, and hexagonal phases.

In some embodiments, the FE crystalline material 140 may comprise a polar, chiral, non-centro-symmetric phase selected from the group consisting of orthorhombic and tetragonal phases.

In some embodiments, the FE crystalline material 140 may comprise a non-centro-symmetric orthorhombic structure corresponding to a space group selected from the group consisting of $Pca2_1$, $Pbc2_1$, $Pmc2_1$, $Pmn2_1$, and $Pna2_1$.

Non-limiting examples of the FE crystalline materials 140 having a non-centro-symmetric orthorhombic structure corresponding to $Pca2_1$ space group may include, but not limited to, $V_2P_2O_9$, $K_3Mo_3ScO_{12}$, $BaYCo_4O_8$, $CaNa_2Al_4Si_4O_{16}$, or $LaNa_3V_2O_8$.

Non-limiting examples of the FE crystalline materials 140 having a non-centro-symmetric orthorhombic structure corresponding to $Pbc2_1$ space group may include, but not limited to, $V_2P_2O_9$, $K_3Mo_3ScO_{12}$, $BaYCo_4O_8$, $CaNa_2Al_4Si_4O_{16}$, or $LaNa_3V_2O_8$.

Non-limiting examples of the FE crystalline materials 140 having a non-centro-symmetric orthorhombic structure corresponding to $Pmc2_1$ space group may include, but not limited to, $SnGa_4Se_7$, $SeO_2$, $Ti_xTa_yLa_zO_{11}$ where x+y+z=3, or $In_{11}Mo_{40}O_{62}$. In one embodiment, the FE crystalline material 140 having a non-centro-symmetric orthorhombic structure corresponding to $Pmc2_1$ space group may be $Ti_{1.92}Ta_{1.08}La_3O_{11}$.

Non-limiting examples of the FE crystalline materials 140 having a non-centro-symmetric orthorhombic structure corresponding to $Pmn2_1$ space group may include, but not limited to, $TiSO_5$, $V_2O_5$, $Sr_5Nb_5O_{16}$, or $ZrMo_2O_8$.

Non-limiting examples of the FE crystalline materials 140 having a non-centro-symmetric orthorhombic structure corresponding to $Pna2_1$ space group may include, but not limited to, $Si_2Y_2O_7$, $Sr_2P_2O_7$, or $Ti_{0.98}Zr_{0.02}RbPO_5$.

In some embodiments, the FE crystalline material 140 may comprise a non-centro-symmetric tetragonal structure corresponding to a space group selected from the group consisting of P422, $P42_12$, $P4_122$, $P4_12_12$, $P4_222$, $P4_22_12$, $P4_322$, and $P4_32_12$.

In some embodiments, the FE crystalline material 140 may be at least substantially free of zirconium and hafnium.

In some embodiments, the FE crystalline material 140 may be doped, mechanically strained, or both to prevent formation of inversion symmetry through an inversion center.

In some embodiments, the FE crystalline material 140 may further comprise a ternary or quaternary oxide material selected from the group consisting of $Ti_{1.1}Zr_{0.893}Hf_{0.008}O_4$, $Ti_{1.92}Ta_{1.08}$ $La_3O_{11}$, $Sr_5Nb_5O_{16}$, $ZrMo_2O_8$, $Si_2Y_2O_7$, and $Ti_{0.98}Zr_{0.02}RbPO_5$.

In some embodiments, the FE crystalline material 140 may include at least one dopant selected from the group consisting of yttrium (Y), lanthanum (La), gadolinium (Gd), niobium (Nb), tantalum (Ta), vanadium (V), phosphorus (P), potassium (K), scandium (Sc), rubidium (Rb), selenium (Se), tin (Sn), magnesium (Mg), calcium (Ca), barium (Ba), and indium (In).

The dopants included in the FE crystalline/polycrystalline material may be utilized to increase the endurance of FE memory cell, lower the coercive-field/voltage (Ec/Vc), modulate the capacitance/dielectric constant and its frequency response, enhance the redox resistance at the interfaces or in the relative bulk, reduce the oxygen vacancy generation/migration and redistribution, as well as to stabilize the FE phase leading to increased remnant/spontaneous polarization.

In some embodiments, the FE crystalline material 140 may comprise a high-k dielectric material doped with at least one metal selected from the group consisting of gadolinium (Gd), lanthanum (La), vanadium (V), phosphorus (P), potassium (K), scandium (Sc), rubidium (Rb), selenium (Se), tin (Sn), magnesium (Mg), calcium (Ca), barium (Ba), and indium (In). The high-k dielectric material comprises hafnium oxide ($HfO_x$), zirconium oxide ($ZrO_x$), titanium oxide ($TiO_x$), hafnium titanium oxide ($HfZrO_x$), hafnium titanium oxide ($HfZrO_x$), or hafnium silicon oxide ($HfSiO_x$). The FE crystalline material 140 may comprise the at least one metal in an amount between about 0.5% and about 30% by weight.

In one embodiment, the FE crystalline material 140 may comprise a high-k dielectric material doped with yttrium (Y), wherein high-k dielectric material comprises hafnium oxide ($HfO_x$), zirconium oxide ($ZrO_x$), titanium oxide ($TiO_x$), hafnium titanium oxide ($HfZrO_x$), hafnium titanium oxide ($HfTiO_x$), or hafnium silicon oxide ($HfSiO_x$). The FE crystalline material 140 may comprise Y in an amount between about 0.5% and about 25% by weight.

In one embodiment, the FE crystalline material 140 may comprise a high-k dielectric material doped with strontium (Sr), wherein high-k dielectric material comprises hafnium oxide ($HfO_x$), zirconium oxide ($ZrO_x$), titanium oxide ($TiO_x$), hafnium titanium oxide ($HfZrO_x$), hafnium titanium oxide ($HfTiO_x$), or hafnium silicon oxide ($HfSiO_x$). The FE crystalline material 140 may comprise Sr in an amount between about 0.05% and about 20% by weight.

In one embodiment, the FE crystalline material 140 may comprise a high-k dielectric material doped with at least one of niobium (Nb) and tantalum (Ta), wherein high-k dielectric material comprises hafnium oxide ($HfO_x$), zirconium oxide ($ZrO_x$), titanium oxide ($TiO_x$), hafnium titanium oxide ($HfZrO_x$), hafnium titanium oxide ($HfTiO_x$), or hafnium silicon oxide ($HfSiO_x$). At least one of Nb and Ta may be present in the FE crystalline material 140 in an amount between about 0.2% and about 10% by weight.

The FE crystalline material 140 may be formed over the substrate 102 by any conventional techniques. Non-limiting examples of the conventional techniques may include, but not limited to, atomic layer deposition (ALD), metal organic atomic layer deposition (MOALD), chemical vapor deposition (CVD), metal organic chemical vapor deposition (MOCVD), and physical vapor deposition (PVD).

In some particular embodiments, the FE crystalline material 140 may be formed over the substrate 102 by ALD or MOALD process based on the precursors of the FE metal oxide, oxidant, and, optionally, the dopant capable of interrupting the inversion symmetry of FE metal oxide. The ALD or MOALD process may be performed at a temperature between about 150° C. and about 350° C., and a pressure between about 10 mtorr and about 10 torr.

Various known oxidants may be used for the process. By way of non-limiting examples, the oxidant may include, but not limited to, water vapor ($H_2O$), hydrogen peroxide ($H_2O_2$), ozone ($O_3$), or oxygen ($O_2$).

When the FE crystalline material 140 comprises Zr-based material, the FE crystalline material 140 may be formed by ALD process based on any known Zr-precursors. Non-limiting examples of Zr-precursors may include, but not limited to, $ZrCl_4$, $C_8H_{24}N_4Zr$, or $(C_5H_5)Zr[N(CH_3)_2]_3$.

When the FE crystalline material 140 comprises Hf-based material, the FE crystalline material 140 may be formed by ALD process based on any known Hf precursors. Non-limiting examples of Hf-precursors may include, but not limited to, $HfCl_4$, $C_8H_{24}N_4Hf$, or $(C_5H_5)Hf[N(CH_3)_2]_3$.

When the FE crystalline material 140 comprises Ti-based material, the FE crystalline material 140 may be formed by ALD process based on any known Ti precursors. Non-limiting examples of Ti-precursors may include, but not limited to, $TiCl_4$, $C_8H_{24}N_4Ti$, or $(C_5H_5)Ti[N(CH_3)_2]_3$.

When the FE crystalline material 140 comprises a dopant, the amount of dopant in the FE crystalline material 140 may be defined by varying the cycle ratio of the precursors. The content of dopant may be monitored and determined by any conventional techniques and, therefore is not described in detail herein. Non-limiting examples of such techniques may include, but not limited to, secondary ions mass spectrometry, X-ray photoelectron spectroscopy (XPS), high resolution transmission spectroscopy (HR-TEM), etc. In some embodiments, the amount of dopant in the FE crystalline material 140 may be in a range of about 0.05% to about 30% by weight. The amount of dopant may depend on the thickness of FE crystalline material 140, the process temperature of 140 or gate electrode material 160, or the annealing conditions such as post metallization annealing (PMA) conditions. For example, when increasing the thickness of FE crystalline material 140, the amount of dopant may also have to be increased to achieve a desired crystallization having ferroelectric properties.

In some embodiments, the thickness of FE crystalline material 140 may be in a range of about 1 nm to about 100 nm. In some embodiments, the thickness of FE crystalline material 140 may be in a range of about 2 nm to about 20 nm.

The gate electrode material 160 may be formed over the FE crystalline material 140 to provide the semiconductor structure. The gate electrode material 160 may be fainted over the FE crystalline material 140 by any conventional techniques. Non-limiting examples of such conventional techniques may include, but not limited to, atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD).

Any conventional gate electrode material may be used for the gate electrode material 160. Such materials may comprise an elemental metal, an alloy of two or more elemental metals, a conductive metal compound, a conductively-doped semiconductor material, or mixtures thereof. Non-limiting examples may include, but not limited to, TiN, TiCN, TiAlN, TiAlCN, Ti—W, Ru—TiN, or RuCN.

Accordingly, the present disclosure describes a ferroelectric memory device including a plurality of memory cells. Each of the memory cells comprises at least one electrode and a ferroelectric crystalline material disposed proximate the at least one electrode. The ferroelectric crystalline material is polarizable by an electric field generated by the at least one electrode in an electrically charged state. The ferroelectric crystalline material has a polar and chiral crystal structure without inversion symmetry through an inversion center. The ferroelectric crystalline material comprises a material selected from the group consisting of hafnium oxide ($HfO_x$), zirconium oxide ($ZrO_x$), titanium oxide ($TiO_x$), hafnium zirconium oxide ($HfZrO_x$), hafnium titanium oxide ($HfTiO_x$), and hafnium silicon oxide ($HfSiO_x$). The ferroelectric crystalline material further comprises least one dopant selected from the group consisting of yttrium (Y), strontium (Sr), niobium (Nb), tantalum (Ta), lanthanum (La), gadolinium (Gd), vanadium (V), phosphorus (P), potassium (K), scandium (Sc), rubidium (Rb), selenium (Se), tin (Sn), magnesium (Mg), calcium (Ca), barium (Ba), and indium (In).

Furthermore, the present disclosure describes a method of forming a semiconductor structure. The method comprises forming a ferroelectric crystalline material over a substrate, and forming at least one electrode proximate the ferroelectric crystalline material. The ferroelectric crystalline material has a polar and chiral crystal structure without inversion symmetry through an inversion center. The ferroelectric crystalline material does not consist essentially of an oxide of at least one of hafnium (Hf) and zirconium (Zr).

In some embodiments, the method may further comprise annealing the ferroelectric crystalline material and altering a crystal structure of the ferroelectric crystalline material.

The FE crystalline material 140 may be annealed to initiate the crystallization into the desired ferroelectric phase. The annealing of FE crystalline material 140 into the desired ferroelectric phase may be performed by post deposition annealing (PDA) or post metallization annealing (PMA) process.

In the PDA process, the FE crystalline material 140 is annealed into the desired ferroelectric phase prior to the formation of the gate electrode material 160 over the FE crystalline material 140.

In the PMA process, the FE crystalline material 140 is annealed into the desired ferroelectric phase after the gate electrode material 160 is formed over the FE crystalline material 140. In some embodiments, the PMA annealing may be performed by a rapid thermal processing (RTP) annealing technique under ambient nitrogen ($N_2$) or argon (Ar) condition.

Thus, in some embodiments, the method may further comprise mechanically straining the ferroelectric crystalline material to stabilize the polar and chiral crystal structure of the ferroelectric crystalline material.

Whether the FE crystalline material 140 is annealed by PDA or PMA process depends on various factors, including, but not limited to, the types of high-k dielectric material, the types and amounts of dopants, or the desired structures of FE crystalline phase.

The PDA or PMA annealing conditions may be defined based on various controlling factors. By non-limiting examples, such controlling factor may include, but not limited to, the composition of FE crystalline material 140, the thickness of FE crystalline material 140, and the composition and thickness of electrode material 160 overlying the FE crystalline material 140 (in case of PMA process). The relatively thinner FE crystalline/polycrystalline material 140 may require a higher annealing temperature and longer annealing times. The annealing requirement is strongly dependent on the choice of FE material 140, such that, in some embodiments of present disclosure, the post metallization anneal may be eliminated, with only a post deposition anneal sufficing. In addition to the thickness of FE crystalline/polycrystalline material 140 and/or electrode material 160, the substrate induced stress may play an important role and may significantly influence the annealing conditions When the FE crystalline material 140 comprises at least one dopant, the annealing conditions of the FE crystalline material 140 may also be a function of the amount and type of dopant present in the FE crystalline material 140. At relatively higher dopant concentrations, the annealing temperature of the FE crystalline material 140 may be higher than the annealing temperature of the FE crystalline material 140 having a lower amount of the dopant.

In the embodiments wherein the FE crystalline material 140 comprises at least one doped metal selected from the group consisting of gadolinium (Gd), lanthanum (La), vanadium (V), phosphorus (P), potassium (K), scandium (Sc), rubidium (Rb), selenium (Se), tin (Sn), magnesium (Mg), calcium (Ca), barium (Ba), and indium (In), the annealing of the FE crystalline material 140 may be achieved by PMA annealing at a temperature between about 500° C. and about 800° C. for about 20 seconds to about 600 seconds.

When the FE crystalline material 140 comprises a high-k dielectric material doped with yttrium (Y), the annealing of the FE crystalline material 140 may be achieved by post deposition annealing (PDA) or post metallization annealing (PMA) at a temperature between about 450° C. and about 800° C. for about 20 seconds to about 600 seconds.

When the FE crystalline material 140 comprises a high-k dielectric material doped with strontium (Sr), the annealing of the FE crystalline material 140 may be achieved by PMA annealing at a temperature between about 450° C. and about 800° C. for about 20 seconds to about 600 seconds.

When the FE crystalline material 140 comprises a high-k dielectric material doped with at least one of niobium (Nb) and tantalum (Ta), the annealing of the FE crystalline material 140 may be achieved by PMA annealing at a temperature between about 450° C. and about 800° C. for about 20 seconds to about 300 seconds.

Accordingly, the present disclosure describes a method of forming a semiconductor structure. The method comprises forming a ferroelectric crystalline material over a substrate. The ferroelectric crystalline material has a polar and chiral crystal structure without inversion symmetry through an inversion center. The ferroelectric crystalline material is selected from the group consisting of hafnium oxide ($HfO_x$), zirconium oxide ($ZrO_x$), titanium oxide ($TiO_x$), hafnium zirconium oxide ($HfZrO_x$), hafnium titanium oxide ($HfTiO_x$), and hafnium silicon oxide ($HfSiO_x$). The ferroelectric crystalline material is doped with at least one dopant selected from the group consisting of yttrium (Y), strontium (Sr), niobium (Nb), tantalum (Ta), lanthanum (La), gadolinium (Gd), vanadium (V), phosphorus (P), potassium (K), scandium (Sc), rubidium (Rb), selenium (Se), tin (Sn), magnesium (Mg), calcium (Ca), barium (Ba), and indium (In). The method further comprises forming at least one electrode proximate the ferroelectric crystalline material.

In some embodiments, the FE crystalline material 140 may be annealed and crystallized into a stable ferroelectric crystalline phase, without requiring the capping effect to stabilize such ferroelectric crystalline phase. By way of a non-limiting example, such stable ferroelectric crystalline phase may be orthorhombic $Pbc2_1$ phase. Accordingly, in such embodiments, the crystallization of FE crystalline material 140 is not necessarily performed in the presence of mechanical confinement (capping) such as those described in U.S. Pat. No. 8,304,823 wherein crystallization of FE crystalline material must be performed in the presence of a covering layer.

Thus, in some embodiments, the method of forming a semiconductor structure comprises crystallizing the FE crystalline material 140 into a ferroelectric phase without the presence of capping.

The FE crystalline material 140 may be patterned before crystallizing into the desired ferroelectric phase. Alternatively, the FE crystalline material 140 may be crystallized into the desired ferroelectric phase prior to or at the same time as patterning the FE crystalline material 140. The patterning of the FE crystalline material 140 may be adapted to the intended use of such FE crystalline material 140. By way of non-limiting examples, the FE crystalline material 140 may be patterned to define at least part of a gate stack of a 1 T-FeRAM (FeFET) or to define a capacitor dielectric material of 1T-1C FeRAM.

Figure 2:
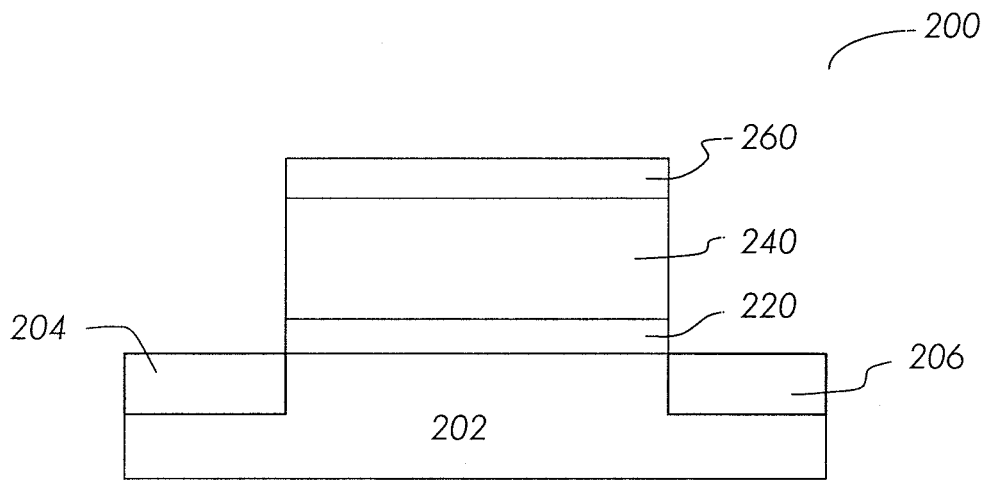
FIG. 2 is a cross-sectional view of a 1T-FeRAM memory cell in accordance with another embodiment of the present disclosure.

FIG. 2 shows another non-limiting example of the disclosed 1T-FeRAM (FeFET) memory cell. 1T-FeRAM memory cell 200 includes a substrate 202, a source 204, a drain 206, an FE crystalline material 240 over the substrate 202, an insulating buffer material 220 between the substrate 202 and the FE crystalline material 240, and a gate electrode material 260 over the FE crystalline material 240. In some embodiments, the insulating buffer material 220 may include a crystallized material that is compatible with the substrate 202 and the FE crystalline material 240. In some embodiments, the insulating buffer material may be silicon oxide, such as $SiO_2$, or silicon oxynitride (SiON). In some embodiments, the thickness of the insulating buffer material 220 may be in a range between about 0.3 nm to about 6 nm. In some embodiments, the thickness of the insulating buffer material 220 may be in a range between about 0.05 nm to about 3 nm.

Figure 3:
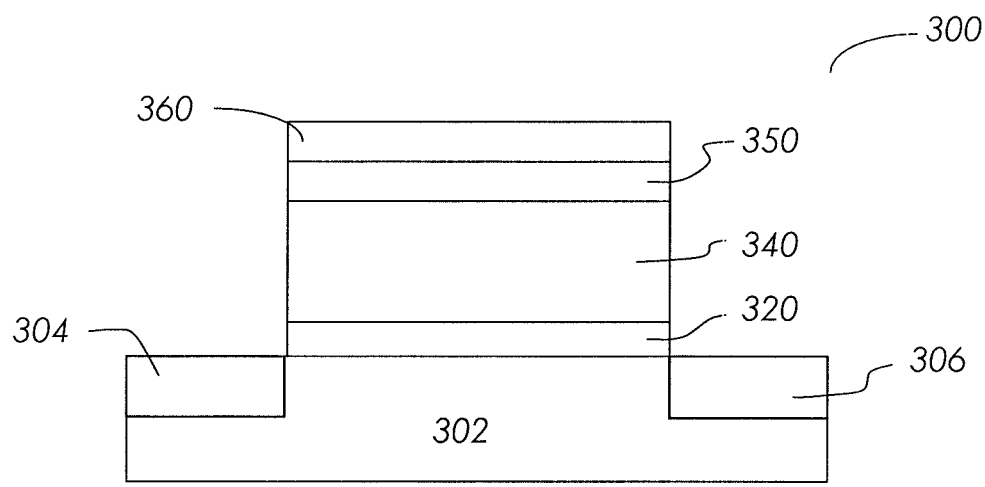
FIG. 3 is a cross-sectional view of a 1T-FeRAM memory cell in accordance with yet another embodiment of the present disclosure.

FIG. 3 shows yet another non-limiting example of the disclosed 1T-FERAM (FeFET) memory cell. 1T-FeRAM memory cell 300 includes a substrate 302, a source 304, a drain 306, a FE crystalline material 340 over the substrate 302, an insulating buffer material 320 between the substrate 302 and the FE crystalline material 340, a gate electrode material 360 over the FE crystalline material 340, and an interfacial material 350 between the FE crystalline material 340 and the gate electrode material 360.

Accordingly, the present disclosure describes a ferroelectric memory cell. The ferroelectric memory cell comprises a ferroelectric crystalline material having a polar and chiral crystal structure without inversion symmetry through an inversion center. The ferroelectric crystalline material does not consist essentially of an oxide of at least one of hafnium (Hf) and zirconium (Zr).

FIGS. 4A-4C illustrate cross-sectional views of the 1T-FeRAM memory cell 400 that comprises a substrate 402, a source 404, a drain 406, a FE crystalline material 440 over the substrate 402, and a gate electrode material 460 over the FE crystalline material 440. The gate electrode material 460 is coupled to a gate voltage Vg; the source 404 is coupled to a source voltage Vs; the drain 406 is coupled to a drain voltage Vd; and a bulk region including source/drain 404/406 embedded therein is coupled to a bulk voltage Vb.

FIG. 4A shows the 1T-FeRAM memory cell 400 in a quiescent state, wherein the voltages of Vd, Vg, Vs, and Vb are set to zero (0) volt (V).

FIG. 4B shows the 1 T-FeRAM memory cell 400 in a "write 0" operational state. The binary information state "0" is written to the 1 T-FeRAM memory cell 400 by setting the gate voltage Vg to above 0 V, and setting Vd, Vs, Vb to 0 V. Hence, an electric field between the bulk (402, 404, 406) and the gate electrode material 460 turns the FE crystalline material 440 to a first polarization state 440B that is associated with the information state "0." For example, as shown in FIG. 4B, the FE crystalline material 440 polarizes such that its dipole moment has a downward arrow direction. When the applied voltage is removed, the polarization state "0" is preserved.

FIG. 4C shows the 1T-FeRAM memory cell 400 in a "write 1" operation state. By setting gate voltage Vg to below 0 V and Vd, Vs, Vb to 0 V, the electric field between the bulk (402, 404, 406) and the gate electrode material 460 is reversed and operational state "write 1" is set. In this operation state, the FE crystalline material 440 is set into a second polarization state 440C that is associated with binary information state "1" and is opposite from the first polarization state 400B. For example, as shown in FIG. 4C, the FE crystalline material 440 polarizes such that its dipole moment has an upward arrow direction. When the applied voltage is removed, the reversed polarization state "1" remains in the FE crystalline material.

Thus, operational states "0" and "1" may be ascribed to different polarization states (440B, 440C) of the FE crystalline material 440. These different polarization states (440B, 440C) result in different threshold voltages of the 1T-FeRAM device.

Under a "read" operational state, the information is read from the 1T-FeRAM memory cell 400 by sensing the current between the source 404 and the drain 406. Read-out from the 1T-FeRAM memory cell 400 may be non-destructive.

FIG. 5 shows a non-limiting example of the disclosed 1T-1C FeRAM memory cell, similar in construction to a DRAM memory cell, wherein one capacitor and one access transistor form a memory cell. While the dielectric material of DRAM cell capacitor is a linear dielectric material, the dielectric material of FeRAM cell capacitor includes a ferroelectric dielectric material.

As shown in FIG. 5, the 1T-1C FeRAM memory cell 500 includes a source 504 and a drain 506 formed within a substrate 502, a conventional transistor acting as an access transistor and comprising a linear dielectric material 545 and a gate electrode 560, and a capacitor 510 coupled to the drain 506 via an interconnection structure 570 (e.g., a contact plug). The capacitor 510 comprises a bottom electrode 590, a top electrode 595, and a FE crystalline material 540 between the bottom and top electrodes 590, 595.

The FE crystalline material 540 may be formed over the bottom electrode 590 using the methods as described earlier for the FE crystalline material 140 of FIG. 1. The crystallization of FE crystalline material 540 into the desired ferroelectric phase may be performed before forming a top electrode 595 over the FE crystalline material 540. Alternatively, the crystallization of FE crystalline material 540 into the desired ferroelectric phase may be performed after or at the same time as forming a top electrode 595 over the FE crystalline material 540.

The bottom and top electrodes 590, 595 may be any conventional electrode materials. The bottom and top electrodes 590, 595 may be formed of the same or different materials. The bottom electrode 590 may be formed as a continuous material, such as at a thickness ranging from about 20 Å to about 200 Å, from about 50 Å to about 130 Å, or from about 40 Å to about 70 Å. In some embodiments, the bottom electrode 590 has a thickness of about 60 Å.

While FIGS. 1-5 show 1T-FeRAM (FeFET) and 1T-1C FeRAM memory cells, it is understood that the present disclosure may be applied to any suitable types of FE memory cells (e.g., 2T-2C FeRAM memory cells). Furthermore, additional acts to form a complete FeRAM device may be performed by conventional fabrication techniques.

The disclosed FE crystalline materials may exhibit significantly higher remnant polarization (Pr) than perovskite materials that are conventionally used as the FE materials for FE memory devices. Thus, the disclosed FE crystalline materials may be suitable for various FE memory device applications. By way of non-limiting examples, the disclosed FE crystalline materials may be used for FERAM devices, or FeFET devices for NAND and NOR applications.

The disclosed FE crystalline materials may satisfy the properties required for use in the FE memory devices, such as high polarization, fast switching speeds, low coercive field, high retention, low fatigue, and low imprint, because of their intrinsic microscopic structure. In addition, these FE crystalline materials may fulfill the extrinsic fabrication requirements, such as low processing temperature, good CMOS compatibility, ease of availability, lower cost, better scalability, etc.

It is to be understood that the cross-sectional views of FeRAM memory cells 100, 200, 300, 400, and 500, illustrated in FIGS. 1-5, merely refer to part of the semiconductor devices. Therefore, the semiconductor devices may comprise a plurality of FeRAM memory cells arranged in the of a ferroelectric memory cell array. Furthermore, additional semiconductor structures may be formed in the substrate. By way of non-limiting examples, these additional semiconductor structures may include, but not limited to, word line drive circuits, bit line drive circuits, source line drive circuits, sense circuits, or control circuits.

Figure 6:
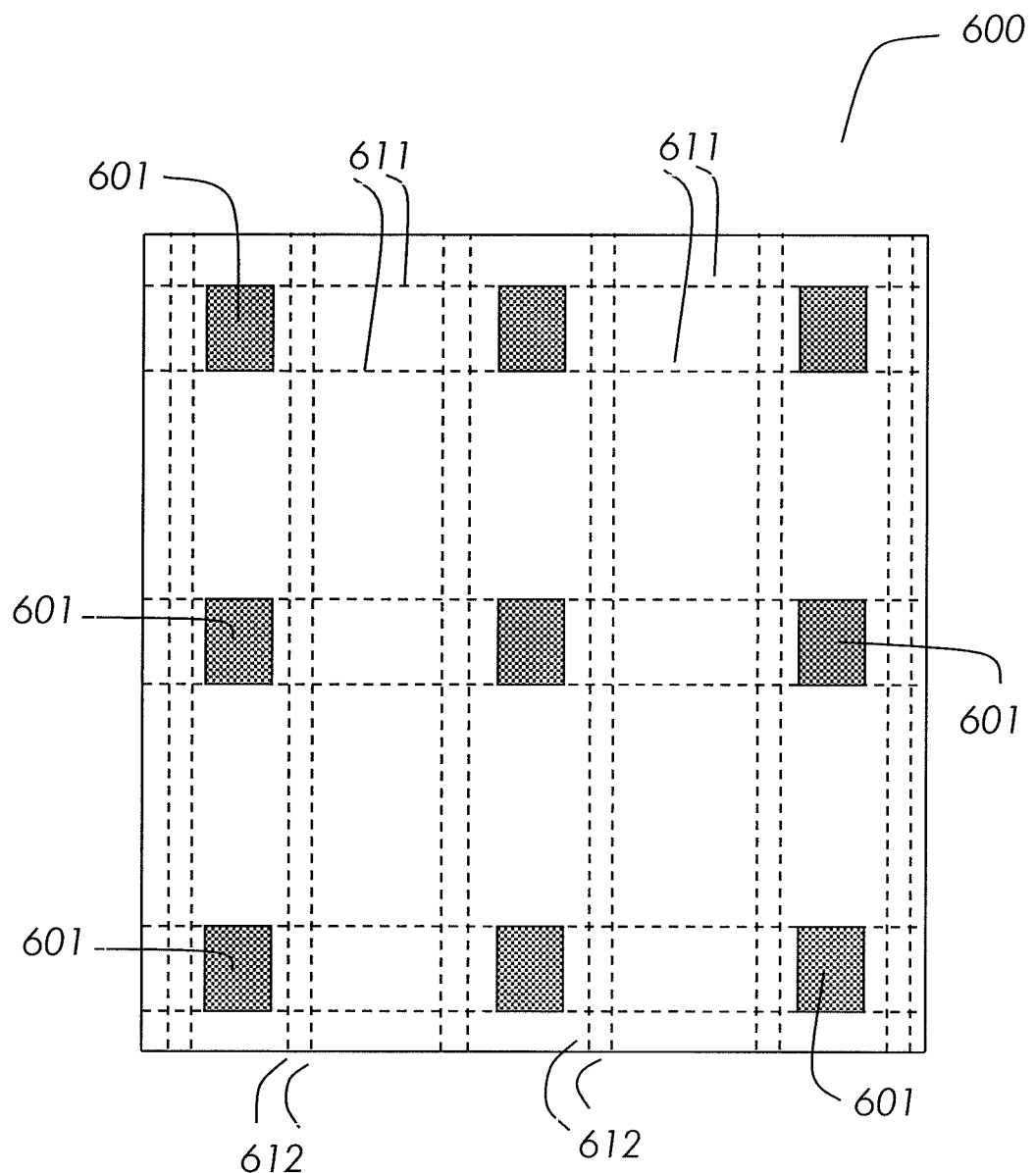
FIG. 6 is a simplified plan view of a portion of a FeRAM memory cell array in accordance with an embodiment of the present disclosure.

FIG. 6 shows a non-limiting example of a portion of a FeRAM memory cell array. The FeRAM memory cell array 600 includes a plurality of memory cells 601, a plurality of digit lines 611 (in dashed lines to show they are buried), and a plurality of word lines 612 (in dashed lines to show they are buried). The FeRAM memory cells 601 are arranged in rows (coupled to a common digit line 611) and in columns (coupled to a common word line 612). Individual FeRAM memory cells 601 are located at a cross-point of a digit line 611 and a word line 612.

Accordingly, the present disclosure describes a ferroelectric memory device including a plurality of memory cells. Each of the memory cells comprises at least one electrode and a ferroelectric crystalline material disposed proximate the at least one electrode. The ferroelectric crystalline material is polarizable by an electric field responsive to an electrical charge of the at least one electrode. The ferroelectric crystalline material has a polar and chiral crystal structure without inversion symmetry through an inversion center. The ferroelectric crystalline material does not consist essentially of an oxide of at least one of hafnium (Hf) and zirconium (Zr).

During use and operation, the FE memory cells of present disclosure may exhibit improved cell performance, such as improved cycling, improved data retention, lower ferroelectric coercivity ($E_c$), and lower electrical field saturation.

The semiconductor structure of present disclosure comprising the FE crystalline material may find applications in integrated circuit other than memory devices.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A ferroelectric memory cell, comprising:
a source;
a drain;
a ferroelectric crystalline material having a polar and chiral crystal structure without inversion symmetry, the ferroelectric crystalline material located between the source and the drain, the ferroelectric crystalline material including a compound selected from the group consisting of $V_2P_2O_9$, $K_3Mo_3ScO_{12}$, $BaYCo_4O_8$, $CaNa_2Al_4Si_4O_{16}$, and $LaNa_3V_2O_8$, the ferroelectric crystalline material also including at least one dopant selected from the group consisting of niobium, tantalum, rubidium, selenium, tin, and indium; and
a gate electrode over the ferroelectric crystalline material.

2. The ferroelectric memory cell of claim 1, wherein the ferroelectric crystalline material has an orthorhombic crystal structure corresponding to a $Pbc2_1$ space group.

3. The ferroelectric memory cell of claim 1, wherein the ferroelectric crystalline material has an orthorhombic crystal structure corresponding to a $Pca2_1$ space group.

4. The ferroelectric memory cell of claim 1, wherein the ferroelectric crystalline material comprises $CaNa_2Al_4Si_4O_{16}$.

5. The ferroelectric memory cell of claim 1, wherein a crystal structure of the ferroelectric crystalline material is orthorhombic.

6. The ferroelectric memory cell of claim 1, wherein the ferroelectric crystalline material is at least substantially free of zirconium and hafnium.

7. The ferroelectric memory cell of claim 1, wherein the ferroelectric crystalline material is further mechanically strained.

8. The ferroelectric memory device of claim 1, wherein the ferroelectric crystalline material comprises a thickness in a range extending from about 2 nm to about 100 nm.

9. A method of forming a semiconductor structure, the method comprising:
forming a source;
forming a drain;
forming a ferroelectric crystalline material having a polar a chiral crystal structure without inversion symmetry through an inversion center, the ferroelectric crystalline material located between the source and the drain, the ferroelectric crystalline material including c compound selected from the group consisting of $V_2P_2O_9$, $K_3Mo_3ScO_{12}$, $BaYCo_4O_8$, $CaNa_2Al_4Si_4O_{16}$, and $LaNa_3V_2O_8$, the ferroelectric crystalline material further including at least one dopant selected from the group consisting of niobium, tantalum, rubidium, selenium, tin, and indium; and
forming a gate electrode proximate the ferroelectric crystalline material.

10. The method of claim 9, further comprising annealing the ferroelectric crystalline material and altering a crystal structure of the ferroelectric crystalline material.

11. The method of claim 9, further comprising mechanically straining the ferroelectric crystalline material to stabilize the polar and chiral crystal structure of the ferroelectric crystalline material.

12. The method of claim 9, further comprising forming the ferroelectric crystalline material to have an orthorhombic crystal structure and a space group selected from the group consisting of $Pca2_1$ and $Pbc2_1$.

13. The method of claim 9, further comprising forming the ferroelectric crystalline material to have a crystal structure selected from the group consisting of orthorhombic and tetragonal structures.

14. The ferroelectric memory cell of claim 1, wherein the at least one dopant consists of niobium and tantalum present in the ferroelectric crystalline material at between about 0.2% by weight and about 10% by weight.

15. The ferroelectric memory cell of claim 1, wherein the at least one dopant constitutes between about 0.05% by weight and about 30% by weight of the ferroelectric crystalline material.

\* \* \* \* \*

UNITED STATES PATENT AND TRADEMARK OFFICE
CERTIFICATE OF CORRECTION

PATENT NO. : 10,242,989 B2
APPLICATION NO. : 14/282520
DATED : March 26, 2019
INVENTOR(S) : Sumeet C. Pandey et al.

Page 1 of 1

It is certified that error appears in the above-identified patent and that said Letters Patent is hereby corrected as shown below:

In the Specification

| | | |
|---|---|---|
| Column 5, | Line 36, | change "hafnium titanium oxide" to --hafnium zirconium oxide-- |
| Column 5, | Line 37, | change "($HfZrO_x$)," to --($HfTiO_x$),-- |
| Column 5, | Line 45, | change "($TiO_x$), hafnium titanium" to --($TiO_x$), hafnium zirconium-- |
| Column 5, | Line 53, | change "($TiO_x$), hafnium titanium" to --($TiO_x$), hafnium zirconium-- |
| Column 5, | Line 61, | change "($TiO_x$), hafnium titanium" to --($TiO_x$), hafnium zirconium-- |
| Column 6, | Line 59, | change "may be fainted" to --may be formed-- |
| Column 9, | Line 28, | change "a 1 T-FeRAM" to --a 1T-FeRAM-- |
| Column 10, | Line 8, | change "the 1 T-FeRAM" to --the 1T-FeRAM-- |
| Column 10, | Line 10, | change "the 1 T-FeRAM" to --the 1T-FeRAM-- |
| Column 11, | Line 37, | change "in the of" to --in the form of-- |

Signed and Sealed this
Twenty-third Day of April, 2019

Andrei Iancu
*Director of the United States Patent and Trademark Office*